US010347497B2

(12) United States Patent
Li et al.

(10) Patent No.: US 10,347,497 B2
(45) Date of Patent: Jul. 9, 2019

(54) CATALYST-ASSISTED CHEMICAL ETCHING WITH A VAPOR-PHASE ETCHANT

(71) Applicant: The Board of Trustees of the University of Illinois, Urbana, IL (US)

(72) Inventors: Xiuling Li, Champaign, IL (US); Jeong Dong Kim, Hillsboro, OR (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 15/712,498

(22) Filed: Sep. 22, 2017

(65) Prior Publication Data

US 2018/0090336 A1    Mar. 29, 2018

Related U.S. Application Data

(60) Provisional application No. 62/398,722, filed on Sep. 23, 2016.

(51) Int. Cl.

| | |
|---|---|
| *H01L 21/306* | (2006.01) |
| *C23F 1/44* | (2006.01) |
| *H01L 21/768* | (2006.01) |
| *C23F 1/12* | (2006.01) |
| *H01L 21/02* | (2006.01) |
| *H01L 21/3065* | (2006.01) |

(Continued)

(52) U.S. Cl.
CPC ........ *H01L 21/30621* (2013.01); *C09K 13/08* (2013.01); *C23F 1/12* (2013.01); *C23F 1/44* (2013.01); *H01L 21/0254* (2013.01); *H01L 21/02381* (2013.01); *H01L 21/3065* (2013.01); *H01L 21/3085* (2013.01); *H01L 21/76864* (2013.01)

(58) Field of Classification Search
CPC .......... H01L 21/30621; H01L 21/3085; H01L 21/3065; H01L 21/0254; H01L 21/76864; H01L 21/02381; C09K 13/04; C23F 1/44; C23F 1/12
See application file for complete search history.

(56) References Cited

U.S. PATENT DOCUMENTS

| | | |
|---|---|---|
| 8,951,430 B2 | 2/2015 | Li et al. |
| 9,263,662 B2 | 2/2016 | Boukai et al. |
| | (Continued) | |

OTHER PUBLICATIONS

Ang, Simon S., "Titanium Nitride Films with High Oxygen Concentration," *Journal of Electronic Materials*, 17, 2 (1988) pp. 95-100.

(Continued)

*Primary Examiner* — Nadine G Norton
*Assistant Examiner* — Mahmoud Dahimene
(74) *Attorney, Agent, or Firm* — Brinks Gilson & Lione (57) ABSTRACT

A method of catalyst-assisted chemical etching with a vapor-phase etchant has been developed. In one approach, a semiconductor substrate including a patterned titanium nitride layer thereon is heated, and an oxidant and an acid are evaporated to form a vapor-phase etchant comprising an oxidant vapor and an acid vapor. The semiconductor substrate and the patterned titanium nitride layer are exposed to the vapor-phase etchant during the heating of the semiconductor substrate. The vapor-phase etchant diffuses through the patterned titanium nitride layer, and titanium nitride-covered regions of the semiconductor substrate are etched. Thus, an etched semiconductor structure is formed.

11 Claims, 5 Drawing Sheets

(51) Int. Cl.
H01L 21/308 (2006.01)
C09K 13/08 (2006.01)

(56) References Cited

U.S. PATENT DOCUMENTS

| | | |
|---|---|---|
| 9,324,820 B1 | 4/2016 | Kelly et al. |
| 2010/0248449 A1 | 9/2010 | Hildreth et al. |
| 2017/0005207 A1 | 1/2017 | Li et al. |
| 2017/0243751 A1 | 8/2017 | Li et al. |

OTHER PUBLICATIONS

Chang, Shih-wei et al., "Metal-Catalyzed Etching of Vertically Aligned Polysilicon and Amorphous Silicon Nanowire Arrays by Etching Direction Confinement," *Adv. Funct. Mater.*, 20 (2010) pp. 4364-4370.

Fukuta, Yamato et al., "Vapor Hydrofluoric Acid Sacrificial Release Technique for Micro Electro Mechanical Systems Using Labware," *Jpn. J. Appl. Phys.*, 42 (2003) pp. 3690-3694.

Hildreth, Owen et al., "Tungsten as a CMOS Compatible Catalyst for the Metal-Assisted Chemical Etching of Silicon to Create 2D and 3D Nanostructures," 2010 Proceedings 60th Electronic Components and Technology Conference (ECTC), Las Vegas, NV, USA (2010) pp. 794-797.

Hildreth, Owen et al., "Vapor Phase Metal-Assisted Chemical Etching of Silicon," *Adv. Funct. Mater.*, 24 (2014) pp. 3827-3833.

Kim, Hyunseok et al., "Local etch control for fabricating nanomechanical devices," *Journal of Applied Physics*, 108 (2010), pp. 074307-1-074307-3.

Kim, Jungkil et al., "Graphene-Assisted Chemical Etching of Silicon Using Anodic Aluminum Oxides as Patterning Templates," *ACS Applied Materials & Interfaces*, 7 (2015) pp. 24242-24246.

Kim, Seung Hyun et al., "Inverse Metal-Assisted Chemical Etching Produces Smooth High Aspect Ratio InP Nanostructures," *Nano Letters*, 15, 1 (2015) pp. 641-648.

Kumar, N. et al., "Transmission electron microscopy studies of brown and golden titanium nitride thin films as diffusion barriers in very large scale integrated circuits," *Journal of Vacuum Science & Technology A: Vacuum, Surfaces, and Films*, 6 (1988) pp. 1602-1608.

Lai, Chang Quan et al., "Mechanics of Catalyst Motion during Metal Assisted Chemical Etching of Silicon," *The Journal of Physical Chemistry C*, 117 (2013) pp. 20802-20809.

Lima, L.P.B. et al., "Titanium nitride as electrode for MOS technology and Schottky diode: Alternative extraction method of titanium nitride work function," *Microelectronic Engineering*, 92 (2012) pp. 86-90.

Liu, Runyu et al., "Enhanced Optical Transmission through MacEtch-Fabricated Buried Metal Gratings," *Advanced Materials*, 28 (2016) pp. 1441-1448.

Sherman, A., "Growth and Properties of LPCVD Titanium Nitride as a Diffusion Barrier for Silicon Device Technology," *J. Electrochem. Soc.*, 137, 6 (Jun. 1990), pp. 1892-1897.

Suni, I. et al., "Performance of titanium nitride diffusion barriers in aluminum-titanium metallization schemes for integrated circuits," *Journal of Vacuum Science & Technology A: Vacuum, Surfaces, and Films*, 3 (1985) pp. 2233-2236.

Ting, C. Y., "TiN formed by evaporation as a diffusion barrier between Al and Si," *Journal of Vacuum Science & Technology*, 21, 1 (1982) pp. 14-18.

CATALYST-ASSISTED CHEMICAL ETCHING WITH A VAPOR-PHASE ETCHANT

RELATED APPLICATIONS

The present patent document claims the benefit of priority under 35 U.S.C. § 119(e) to U.S. Provisional Patent Application Ser. No. 62/398,722, which was filed on Sep. 23, 2016, and is hereby incorporated by reference in its entirety.

TECHNICAL FIELD

The present disclosure is related generally to chemical etching of semiconductors and more particularly to metal-assisted chemical etching (MacEtch).

BACKGROUND

Metal-assisted chemical etching (MacEtch or MaCE) is a local electrochemical etching method capable of producing anisotropic, high-aspect ratio semiconductor structures with a simple wet etching process. MacEtch can avoid ion-induced damage and sidewall scallops characteristic of conventional deep reactive ion etching. Nanowires, vias and trenches with electronic and optoelectronic device applications have been demonstrated using MacEtch on silicon and compound semiconductor substrates.

A typical silicon MacEtch process starts by depositing a metal catalyst onto a silicon substrate. The metal catalyst can be patterned into any arbitrary two-dimensional shape. Then, the silicon substrate is immersed in a solution mixture of a suitable acid and oxidant to selectively oxidize and dissolve portions of the silicon substrate localized under the metal catalyst. During MacEtch, at the liquid-catalyst interface, electronic holes are produced by the reduction reaction of the oxidant (cathodic reaction) and injected in the valence band to produce oxidized silicon (anodic reaction), which is selectively dissolved by the acid.

Noble metals such as gold (Au) have been reported to be effective MacEtch catalysts. However, despite various advantages and simplicity, gold catalysts may be associated with deep level defects in silicon; thus, there are limitations in applying MacEtch to electronic device applications, specifically front end of the line (FEOL) and back end of the line (BEOL) processes in complementary metal-oxide-semiconductor (CMOS) fabrication. In addition, the MacEtch process can be associated with "inverse" etching, where regions of the semiconductor substrate that are not localized under the metal catalyst undergo unintended etching.

BRIEF SUMMARY

A method of catalyst-assisted chemical etching with a vapor-phase etchant has been developed.

According to one embodiment of the method, a semiconductor substrate including a patterned titanium nitride layer thereon is heated, and an oxidant and an acid are evaporated to form a vapor-phase etchant comprising an oxidant vapor and an acid vapor. The semiconductor substrate and the patterned titanium nitride layer are exposed to the vapor-phase etchant during the heating of the semiconductor substrate. The vapor-phase etchant diffuses through the patterned titanium nitride layer, and titanium nitride-covered regions of the semiconductor substrate are etched. Thus, an etched semiconductor structure is formed.

According to another embodiment, the method comprises heating a semiconductor substrate having a patterned catalyst layer thereon, and depositing one or more droplets comprising a mixture of an oxidant and an acid onto or adjacent to the semiconductor substrate in a vicinity of the patterned catalyst layer. The one or more droplets increase in temperature and evaporate to form a vapor-phase etchant comprising an oxidant vapor and an acid vapor. The vapor-phase etchant diffuses through the patterned catalyst layer and catalyst-covered regions of the semiconductor substrate are etched, thereby forming an etched semiconductor structure.

According to another embodiment, the method comprises heating a sample to be etched in an enclosed chamber, where the sample comprises a semiconductor substrate with a patterned catalyst layer thereon. An oxidant source which is in fluid communication with the enclosed chamber and which comprises an oxidant is heated to form an oxidant vapor, and an acid source which is in fluid communication with the enclosed chamber and which comprises an acid is heated to form an acid vapor. During the heating of the sample, the sample is exposed to a vapor-phase etchant comprising the oxidant vapor and the acid vapor. The vapor-phase etchant diffuses through the patterned catalyst layer and etches catalyst-covered regions of the semiconductor substrate. Thus, an etched semiconductor structure is formed.

A method of titanium nitride-assisted chemical etching with a liquid-phase etchant comprises providing a patterned TiN layer on a semiconductor substrate, and immersing the patterned TiN layer and the semiconductor substrate into an etchant solution comprising an acid and an oxidizing agent. During the immersion in the etchant solution, at least a portion of the semiconductor substrate immediately below the patterned TiN layer is selectively removed, thereby forming an etched semiconductor structure.

DETAILED DESCRIPTION

A new approach to metal-assisted chemical etching ("MacEtch") that utilizes a vapor-phase etchant to chemically carve out high-aspect ratio features in semiconductors has been developed. The new chemical etching technique, which may be referred to as vapor-phase MacEtch, can avoid ion-induced damage common to reactive ion etching methods as well as the undesirable inverse etching that can occur with conventional liquid-phase MacEtch. Using a novel, CMOS-compatible titanium nitride catalyst, vapor-phase MacEtch can produce high-aspect ratio features in silicon without introducing deep-level defects, a common problem when metal catalysts such as gold are employed. The new chemical etching method may be employed with the CMOS-compatible titanium nitride catalyst or with conventional metal catalysts to etch a broad range of semiconductors. Since a metal catalyst is not required, vapor-phase MacEtch may be described as vapor-phase, catalyst-assisted chemical etching.

Figure 1:
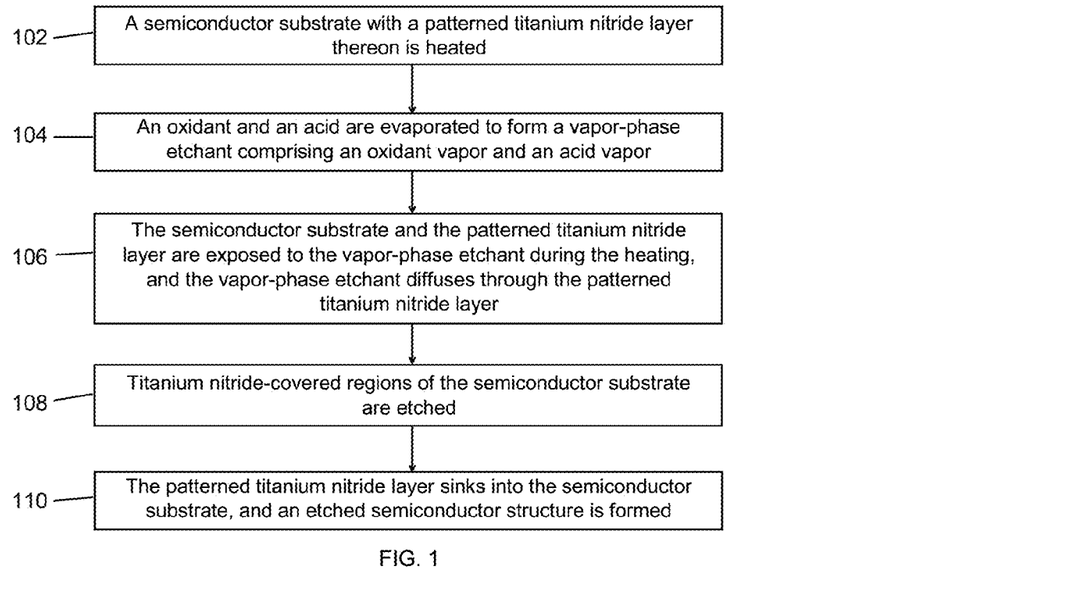
FIG. 1 is a flow chart of an exemplary method of vapor-phase, catalyst-assisted chemical etching, which may be referred to as vapor-phase MacEtch.
Figures 2A, 2B:
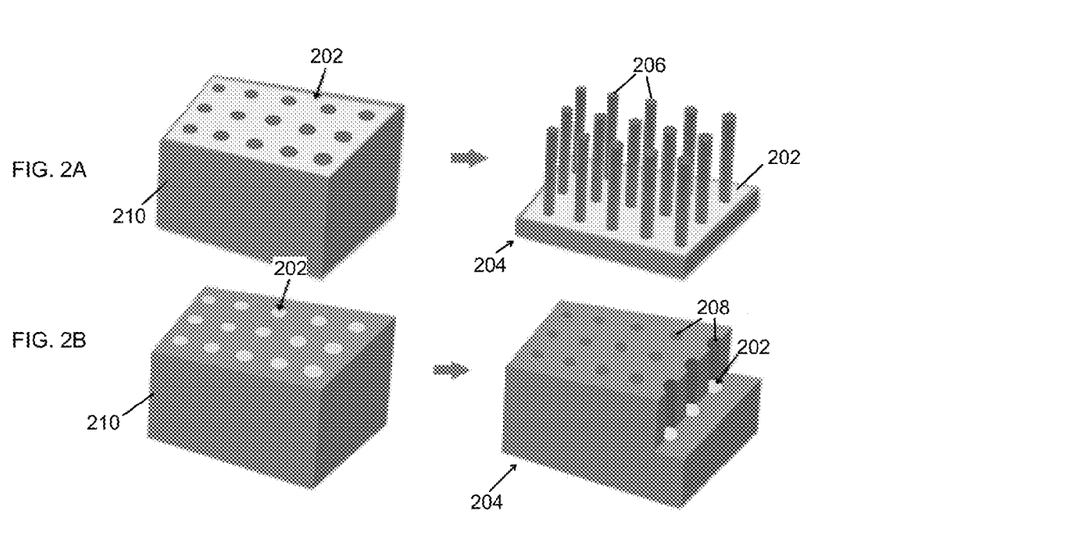
FIG. 2A is a schematic showing a semiconductor substrate covered by a patterned catalyst layer having a continuous mesh pattern before (left) and after (right) vapor-phase MacEtch.
FIG. 2B is a schematic showing a semiconductor substrate covered by a patterned catalyst layer having a discontinuous pattern before (left) and after (right) vapor-phase MacEtch.

Described in reference to FIGS. 1 and 2 is a vapor-phase MacEtch process utilizing the new CMOS-compatible titanium nitride catalyst. Then, two different approaches to implementing vapor-phase MacEtch with the titanium nitride catalyst or another suitable catalyst (e.g., a metal catalyst) are described in reference to FIGS. 3 and 4. Also described below is the use of the new electrically conductive titanium nitride catalyst with conventional liquid-phase MacEtch.

Referring first to the flow chart of FIG. 1, a vapor-phase chemical etching process utilizing the titanium nitride catalyst is described. The method entails heating 102 a semiconductor substrate that includes a patterned titanium nitride layer thereon. Given the CMOS-compatibility of titanium nitride, the semiconductor substrate may comprise silicon (but is not limited to silicon). An oxidant and an acid, such as hydrogen peroxide ($H_2O_2$) and hydrofluoric acid (HF), respectively, are evaporated 104 to form a vapor-phase etchant comprising an oxidant vapor (e.g., $H_2O_2$ vapor) and an acid vapor (e.g., HF vapor).

The semiconductor substrate and the patterned titanium nitride layer thereon are exposed 106 to the vapor-phase etchant as the semiconductor substrate is heated, and the vapor-phase etchant diffuses through the patterned titanium nitride layer. Though a nonmetal, titanium nitride can act as a catalyst for etching, which is unexpected. The suitability of titanium nitride may be due to its high work function (about 4.2-4.5 eV) and electrochemical potential (about 0.5-0.9 V), in combination with resistance to HF. The oxidant vapor selectively oxidizes regions of the semiconductor substrate underneath the patterned titanium nitride layer (i.e., titanium nitride-covered regions), and the acid vapor selectively removes the oxidized regions. Accordingly, titanium nitride-covered regions of the semiconductor substrate are etched 108, inducing the patterned titanium nitride layer to sink into the semiconductor substrate. Thus, an etched semiconductor structure is formed 110.

Referring to FIG. 2A, the patterned titanium nitride layer 202 on the semiconductor substrate 210 may take the form of a continuous mesh pattern (left schematic). Once forward etching is successfully carried out, as described in the flow chart of FIG. 1, the etched semiconductor structure 204 may comprise an array of nanowires 206 (right schematic). Alternatively, the patterned titanium nitride layer 202 may take the form of a discontinuous pattern comprising a plurality of discrete features, as shown for example in FIG. 2B (left schematic). In this case, following forward etching, the etched semiconductor structure 204 may comprise an array of channels 208 (right schematic).

Uncovered regions of the semiconductor substrate 210 may be substantially unetched; in other words, inverse etching may be minimized or avoided altogether with the vapor-phase MacEtch process described here. In contrast, using conventional liquid-phase MacEtch with a titanium nitride catalyst, inverse etching of the semiconductor substrate is difficult to avoid, as discussed in the Examples below. To facilitate forward etching, the semiconductor substrate 210 may be heated to a temperature in a range from about 30° C. to about 95° C., or from about 50° C. to about 95° C. Experiments show that an increased etching temperature may enhance mass transfer during etching, thereby promoting forward etching and enabling the fabrication of higher aspect ratio etched features. The vapor-phase etchant may be at approximately the same temperature as the semiconductor substrate 210 to minimize or eliminate condensation of the etchant on the sample surface, which could block the diffusion path of the vapor-phase etchant and byproduct vapor species through the patterned titanium nitride layer. Also or alternatively, the process may be carried out in a controlled environment comprising an inert atmosphere or a vacuum.

Figure 3:
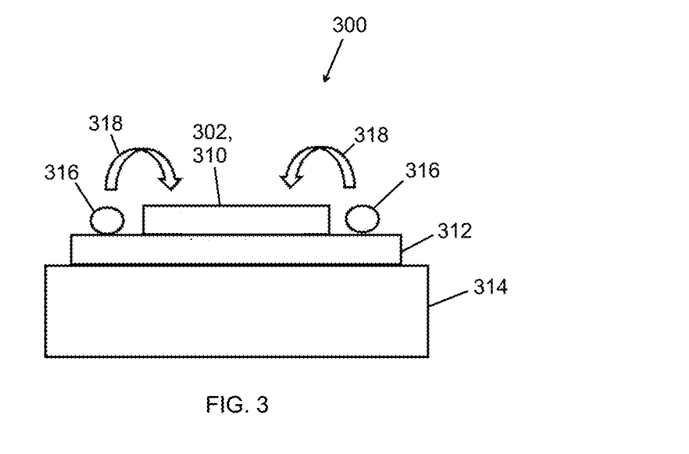
FIG. 3 shows an exemplary apparatus for vapor-phase MacEtch.

As shown in FIG. 3 and described in detail below, evaporating the oxidant and the acid to form the vapor-phase etchant may entail depositing one or more droplets comprising a mixture of the oxidant and the acid onto or adjacent to the semiconductor substrate. The one or more droplets are deposited in a vicinity of the patterned titanium nitride layer prior to or during the heating of the semiconductor substrate.

Figure 4:
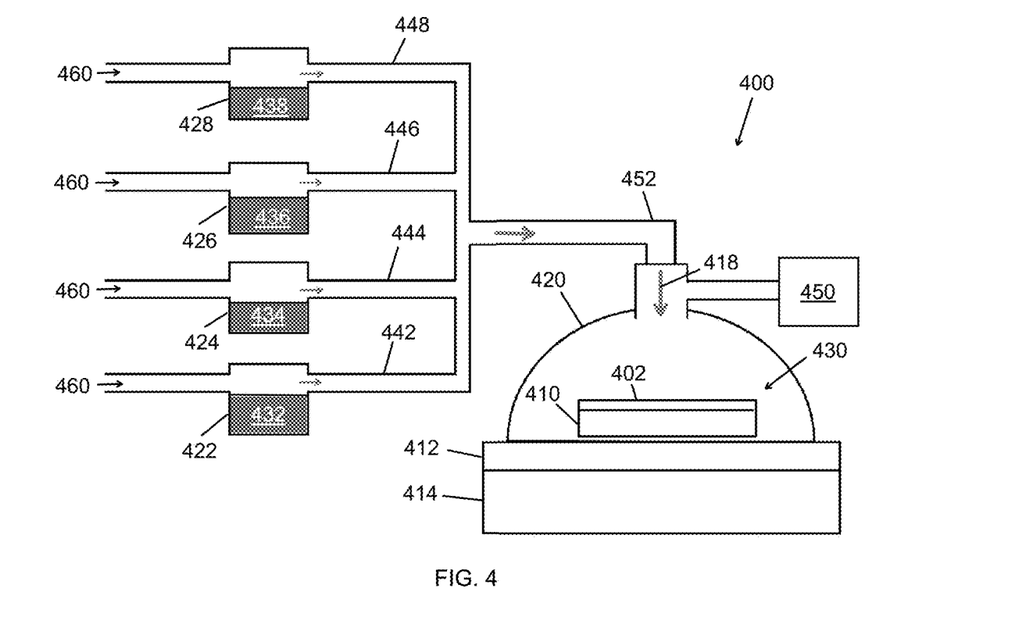
FIG. 4 shows an exemplary apparatus for vapor-phase MacEtch.

As shown in FIG. 4 and described in detail below, evaporating the oxidant and the acid to form the vapor-phase etchant may comprise separately heating an oxidant source containing the oxidant to form the oxidant vapor and separately heating an acid source containing the acid to form the acid vapor. In such an example, the semiconductor substrate may be disposed in an enclosed chamber which is connected to each of the oxidant source and the acid source by a flow channel, and evaporation of the oxidant and the acid may occur at locations remote from the sample to be etched.

Returning to the example of FIG. 3, evaporation of the oxidant and the acid may occur in a vicinity of the patterned catalyst layer, that is, within a few centimeters of the patterned catalyst layer. FIG. 3 shows a sample 300 including a patterned catalyst layer 302 on a semiconductor substrate 310 supported by a sample support 312, which in turn is supported on a hot plate 314 or other heat source. The patterned catalyst layer 302 may be a patterned titanium nitride (TiN) layer or another patterned metal catalyst, as set forth below, and the semiconductor substrate 310 may comprise silicon or another substrate, also as set forth below. Additionally, the patterned catalyst layer 302 may have any desired two-dimensional pattern, such as one of the continuous or discontinuous patterns illustrated in FIGS. 2A and 2B.

Prior to or during heating of the semiconductor substrate 310, one or more droplets 316 comprising a mixture of the oxidant and the acid are deposited on or adjacent to the semiconductor substrate 310 in a vicinity of the patterned catalyst layer 302. In this example, the droplet(s) 316 are deposited on the sample support 312 that underlies and extends beyond the semiconductor substrate 304. Typically, each droplet 316 has a volume in a range from about 1 μL to about 100 μL, such as from 2 μL to 20 μL. The droplet(s) 316 increase in temperature and evaporate, and the semiconductor substrate 310 and the patterned catalyst layer 302 are exposed to a vapor-phase etchant 318 comprising an oxidant vapor and an acid vapor. As described above, the vapor-phase etchant 318 diffuses through the patterned catalyst layer 302, and the oxidant vapor selectively oxidizes catalyst-covered regions of the semiconductor substrate 310 while the acid vapor removes the catalyst-covered regions post-oxidation. Once each droplet 316 evaporates, another droplet comprising a mixture of the oxidant and the acid may be deposited and evaporated as described above, and so on until the vapor-phase etching process is complete. Thus, catalyst-covered regions of the semiconductor substrate are etched, causing the patterned catalyst layer 302 to sink into the semiconductor substrate 310 as shown in FIGS. 2A and 2B, and an etched semiconductor structure is formed.

Uncovered regions of the semiconductor substrate 310 may be substantially unetched; in other words, inverse etching may be minimized or avoided altogether with the vapor-phase MacEtch process described in reference to FIG. 3. To facilitate forward etching, the semiconductor substrate 310 may be heated to a temperature in a range from about 30° C. to about 95° C., or from about 50° C. to about 95° C. The vapor-phase etchant 318 may be at approximately the same temperature as the semiconductor substrate 310 to minimize or eliminate condensation of the etchant 318 on the sample surface, which could block the diffusion path of the vapor-phase etchant and byproduct vapor species through the patterned catalyst layer 302. The process may be carried out in a controlled environment comprising an inert atmosphere or a vacuum.

In the approach of FIG. 4, the evaporation of the oxidant and the acid to form the vapor-phase etchant occurs away from the semiconductor substrate, and the oxidant and acid are provided separately prior to vaporization, instead of as a mixture. Independent vaporization can permit precise control of the oxidant-to-acid ratio since different temperatures may be used to heat and evaporate each species. Once produced, the semiconductor substrate is exposed to the vapor-phase etchant.

The method may be carried out in the reactor 400 shown in FIG. 4, which includes an enclosed chamber 420 configured to hold a sample 430 in a controlled environment (e.g., an inert gas atmosphere or a vacuum). An oxidant source 422 containing an oxidant 432 is connected to the enclosed chamber 420 by a first flow channel 442, and an acid source 424 containing an acid 434 is connected to the enclosed chamber 410 by a second flow channel 444. The sample includes a semiconductor substrate 410 with a patterned catalyst layer 402 thereon. The patterned catalyst layer 402 may be a patterned TiN catalyst layer or a patterned metal catalyst layer having any desired two-dimensional pattern, and the semiconductor substrate 410 may comprise silicon or another substrate.

Additional vapor sources, including a water vapor source 426 and/or an alcohol (e.g., isopropyl alcohol) source 428, may be provided and, in this example, connected to the enclosed chamber 420 by additional flow channels 446,448. The enclosed chamber 420 may also be connected to one or more pumps 450 to provide the desired controlled environment, such as a vacuum or a low-pressure inert gas atmosphere.

To carry out the method, the oxidant source 422 containing the oxidant 432 is heated to form an oxidant vapor, and the oxidant vapor is transported through the first flow channel 442 to the enclosed chamber 420. Typically simultaneously, the acid source 424 containing the acid 434 is heated to form an acid vapor, and the acid vapor is transported through the second flow channel 444 to the enclosed chamber 420. Since the oxidant 432 and the acid 434 are heated separately, the oxidant 432 can be heated to a temperature selected to produce a particular vapor pressure of the oxidant 432, while the acid 434 is heated to a temperature selected to produce a particular vapor pressure of the acid 434. Any additional vapor sources (e.g., the water vapor and/or alcohol sources) 426,428 may also be heated to a suitable temperature to produce a desired vapor pressure of each species 436,438. The water and/or alcohol vapor may function in part as a carrier gas during transport of the oxidant and acid vapors to the sample 430. Together, the oxidant vapor and the acid vapor form a vapor-phase etchant 418 which is exposed to the sample in the enclosed chamber.

The sample 430 to be etched in the enclosed chamber 420 is also heated. For example, a resistive heating element or hot plate 414 underlying the semiconductor substrate 410 may act as a heat source for the sample, as illustrated in FIG. 4. In this example, the sample 430 to be etched is placed on a sample support (e.g., silicon carbide substrate) 412 that is in contact with the heat source 414. The sample 430 may alternatively be heated by a remote heat source, such as a laser, which is located outside the enclosed chamber 420.

As the sample 430 is heated, the vapor-phase etchant 418 diffuses through the patterned catalyst layer 402 and etches catalyst-covered regions of the semiconductor substrate 410, thereby forming an etched semiconductor structure. Once etching is concluded, water vapor (only) may be supplied to the enclosed chamber 420 to rinse the etched semiconductor structure and an interior of the chamber 420.

Each vapor may be transported from the vapor source to the chamber using a carrier gas. Referring again to FIG. 4, a carrier gas 460 may be flowed through the oxidant source 422 at a predetermined pressure or flow rate to transport the oxidant vapor through the first flow channel 442. The oxidant vapor becomes entrained in the carrier gas 460 and is delivered from the oxidant source 422 to the enclosed chamber 420. Similarly, a carrier gas 460 is flowed through the acid source 424 at a predetermined pressure or flow rate, entraining the acid vapor and delivering it from the acid source 424 to the enclosed chamber 420. The carrier gas 460 used to transport the oxidant vapor and the acid vapor may be an inert carrier gas such as nitrogen, argon or helium. Typically, the same carrier gas 460 is used for transporting the oxidant, acid, and/or other vapors, although different carrier gases may be used if desired. A mass flow controller can be used to monitor and control the flow of the carrier gas through each vapor source, which may take the form of a gas bubbler.

As shown in FIG. 4, the first flow channel and the second flow channel 442,444 (as well as any additional flow channels 446,448) may converge to a single flow inlet 452 prior to entering the enclosed chamber 420. In this case, the vapor-phase etchant 418 is formed from the oxidant vapor and the acid vapor in the single flow inlet 452 prior to reaching the enclosed chamber 420. Alternatively, the first flow channel and the second flow channel may enter the enclosed chamber through separate flow inlets, and the vapor-phase etchant may be formed from the oxidant vapor and the acid vapor in the enclosed chamber.

In other embodiments of the method, the vapor sources (oxidant, acid, water, and/or alcohol sources) may be configured for separate heating but positioned within the same enclosed chamber as the sample to be etched. Whether positioned remote from the sample, as shown in FIG. 4, or adjacent to the sample (e.g., within the enclosed chamber, as possible in an alternative embodiment), the separately heated vapor source(s) may be said to be in fluid communication with the enclosed chamber. For one component to be "in fluid communication with" another component means that fluid (or more particularly vapor) from the one component can reach the other component.

Uncovered regions of the semiconductor substrate 410 may be substantially unetched; in other words, inverse etching may be minimized or avoided altogether with the vapor-phase MacEtch process described in reference to FIG. 4. To facilitate forward etching, the semiconductor substrate 410 may be heated to a temperature in a range from about 30° C. to about 95° C., or from about 50° C. to about 95° C. The vapor-phase etchant 418 may be at approximately the same temperature as the semiconductor substrate 410 to minimize or eliminate condensation of the etchant 418 on the sample surface, which could block the diffusion path of the vapor-phase etchant 418 and byproduct vapor species through the patterned catalyst layer 402.

For the vapor-phase MacEtch processes described above in reference to FIGS. 1-4, the oxidant and oxidant vapor may comprise hydrogen peroxide ($H_2O_2$), $KMnO_4$, $K_2S_2O_8$, and/or $Na_2S_2O_8$, and the acid and acid vapor may comprise hydrofluoric acid (HF) and/or nitric acid ($HNO_3$), depending on the catalyst employed for etching and the semiconductor being etched. Generally speaking, the vapor pressure (or partial vapor pressure) of the oxidant and the vapor pressure (or partial vapor pressure) of the acid are selected to achieve the desired molar ratio. In an example where the semiconductor comprises silicon, the patterned catalyst layer comprises titanium nitride, the oxidant is hydrogen peroxide, and the acid is hydrofluoric acid, the partial vapor pressure of the oxidant may be from about 1 Torr to about 10 Torr, the partial vapor pressure of the acid may be from about 20 Torr to about 60 Torr, and the vapor-phase etchant may have a molar ratio of oxidant vapor to acid vapor in a range from about 0.02 to about 10.

The length of time the semiconductor substrate and the patterned catalyst layer are exposed to the vapor-phase etchant during heating may determine the etching duration. Typically, etching is carried out for a duration of about several seconds to tens of minutes. The length of the etched features (e.g., channels, nanowires, nanopillars, or other high-aspect ratio morphology) formed in the etched semiconductor structure depends on the etching duration. For example, the etching duration may be from about 10 seconds to about 60 minutes. Typically, the time duration is from about 1 minute to about 30 minutes, or from about 5 minutes to about 20 minutes. High aspect ratio etched features of up to hundreds of nanometers or even tens of microns in length can be obtained.

As indicated above, the semiconductor substrate and the etched semiconductor structure may comprise any of a number of semiconductors, including silicon, germanium, and III-V semiconductors. The patterned catalyst layer may comprise TiN, as discussed above, or a metal such as Ag, Au, Cu, Pd or Pt. Typically, the patterned catalyst layer has a thickness in a range from about 10 nm to about 50 nm. Given that TiN has a significantly higher stiffness than more conventionally used metal catalysts, thinner TiN layers (e.g., less than 10 nm in thickness) may provide better adhesion with the semiconductor substrate, which may promote forward etching. For example, the patterned TiN layer may have a thickness in a range from about 2 nm to about 10 nm.

The etch rate for vapor-phase MacEtch may in some cases be much higher than that achievable by liquid-phase MacEtch. For example, using TiN as a catalyst, the etch rate may be increased by about 6 to 10 times or more. This is because of the enhancement of the mass transport rate in the gas phase. However, for cases where etching is not limited by mass transport, such as Au-catalyzed MacEtch of silicon using a relatively high HF concentration, the etch rate using vapor-phase MacEtch may be slower than that obtained with liquid-phase MacEtch.

As indicated above, the new TiN catalyst may also be employed with liquid-phase MacEtch of silicon or other semiconductors. The method of liquid-phase TiN-assisted chemical etching may comprise providing an electrically-conductive patterned TiN layer on a semiconductor substrate, which may comprise any of the semiconductors set forth above. At least a portion of the semiconductor immediately below the patterned TiN layer may be selectively removed by immersing the patterned TiN layer and the semiconductor substrate into an etchant solution comprising an acid and an oxidizing agent, where the acid and the oxidizing agent are as described above. For example, a continuous or discontinuous patterned TiN layer formed on silicon may undergo liquid-phase MacEtch in a solution of hydrofluoric acid and hydrogen peroxide. Other details of liquid-phase MacEtch are provided in U.S. Pat. No. 8,951, 430, U.S. Patent Application Publication No. 2017/0005207, and U.S. Patent Application Publication No. 2017/0243751, all of which are hereby incorporated by reference in their entirety.

The liquid-phase TiN-catalyzed chemical etching may occur at room temperature or at an elevated temperature (e.g., from about 30° C. to about 95° C., or from about 50° C. to about 95° C., where etching temperature may refer to the temperature of the etchant solution). Experiments reveal that forward MacEtch may be enhanced during vapor-phase and/or liquid-phase etching by increasing the mass transport by raising the etching temperature and/or by reducing the thickness of the TiN layer.

For example, liquid-phase TiN-assisted MacEtch of silicon may be aided by etching temperatures of about 50° C. or higher (e.g., up to about 95° C.), and enhanced forward etching may be obtained at reduced thicknesses. For example, silicon overlaid with a discontinuous patterned TiN layer of 10 nm or 30 nm in thickness has been shown to experience different amounts of forward and inverse etching. Under liquid-phase MacEtch at room temperature, the silicon underlying the 10 nm patterned TiN layer is partially forward etched, while the silicon underlying the 30 nm patterned TiN layer is inverse etched. This may be explained by the difference in stiffness of the TiN as function of the thickness, where thicker, and consequently stiffer, layers of TiN may be more easily detached at an edge from the silicon substrate during MacEtch. A poor interface between the patterned TiN layer and the semiconductor substrate can decrease the forward MacEtch rate, and unconsumed holes can be diffused on the uncovered regions of the substrate, which can accelerate inverse MacEtch.

Also, mass transport may be affected by dimensions of the patterned catalyst layer in both liquid-phase and vapor-phase MacEtch. For example, a smaller-diameter mesh pattern (e.g, a mesh-patterned TiN layer) may undergo increased inverse etching compared to a larger-diameter mesh pattern due to more limited mass transport resulting from a larger spacing between openings. As the diameter increases, forward MacEtch may start to dominate.

Mechanism

As described above, during MacEtch of silicon, electronic holes are produced underneath the catalyst by the reduction reaction of the oxidant (cathodic reaction) and injected in the valence band to produce oxidized silicon (anodic reaction), which is selectively dissolved by the acid. The process of hole generation, injection and diffusion in the semiconductor is defined as carrier generation (CG), and the transport of the etchant and byproducts is defined as mass transport (MT). In a CG dominant regime, MacEtch is governed by the number of holes injected in the semiconductor, and in a MT dominant regime, it is governed by the rate of oxidized Si removal. Inverse etching may result when mass transport is insufficient, and the injection and diffusion of holes occurs faster than the removal of oxidized silicon underneath the catalyst. Using the e MacEtch techniques described herein, mass transport can be enhanced and the transition from inverse to forward MacEtch can be achieved.

Figure 5:
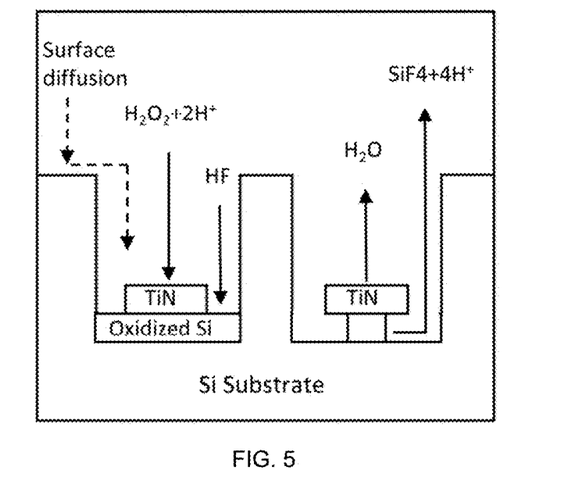
FIG. 5 illustrates a proposed mechanism of vapor-phase MacEtch when silicon is etched with a titanium nitride catalyst.

FIG. 5 shows a cross-sectional 2D schematic of the vapor-phase TiN-assisted chemical etching mechanism. The etching mechanism can be understood as having two components: (a) diffusion of the vapor-phase etchant (comprising the reactants, HF vapor and $H_2O_2$ vapor) and (b) vapor-phase diffusion of the byproducts ($H_2O$, $H_2SiF_6$, and $H_2$). When $H_2O_2$ and H+ vapor diffuse on the patterned TiN layer, holes are generated and injected in the valance band of the TiN-covered silicon region by reduction reaction to produce oxidized Si under the patterned TiN layer. When $H_2O_2$ and H+ vapor diffuse on uncovered silicon regions, the reduction reaction does not occur due to the absence of the catalyst; thus the uncovered silicon regions serve as a mask that allows the etchant species to be diffused in a lateral direction until they reach the nearest TiN catalyst. Vertical etching occurs when the HF vapor diffuses on the oxidized Si produced by hole injection. Since only the oxidized Si is chemically etched by HF, the effective amount of the HF vapor is again contributed by the vapor diffusing perpendicular to the oxidized Si and the vapor surface diffusing from Si or TiN to the oxidized Si. The byproduct of the reduction reaction ($H_2O$) is evaporated from the TiN interface to the surrounding atmosphere. The byproducts of $SiO_2$ etching ($H_2$, $SiF_4$ and $H_2SiF_6$) are diffused from under the TiN to the atmosphere. The liquid byproducts ($H_2O_2$ and $H_2SiF_6$) may need to be evaporated to be diffused to the surrounding atmosphere while the vapor byproducts ($H_2$, $SiF_6$) can be diffused as they are produced. If the evaporation rate of the liquid byproducts is slowed due to a low substrate temperature, the vapor byproducts can be trapped under the TiN catalyst, which can lead to the delamination or cracking of the catalyst.

Vertical etching is defined by the transport of the etchant and byproducts, similar to liquid-phase MacEtch. However, diffusion in the vapor phase is affected by temperature to the order of 3/2 according to Chapman-Enskog theory; in contrast, in the liquid phase, the diffusion coefficient of the solution is affected by the dynamic viscosity of the solution according to the Stokes-Einstein equation. Therefore, the MT can be significantly enhanced using vapor-phase MacEtch to overcome the limited MT resulting from a strong van der Waals force between the patterned TiN layer and the Si substrate.

Examples

Samples comprising a patterned TiN layer (a TiN mesh pattern) of 30 nm in thickness on a silicon substrate are subjected to both liquid-phase and vapor-phase MacEtch.

Boron-doped p-type silicon substrates having a (100) orientation with a resistivity of 1-100 Ω-cm are used. The native oxide is etched in 1:100 HF:DI for 60 seconds. Then, a TiN layer of 5 nm, 10 nm, or 30 nm in thickness is deposited with plasma vapor deposition. A discontinuous patterned TiN layer can be fabricated by selective lift-off of the TiN layer on native oxide with BOE wet etching. To form a continuous patterned TiN layer (e.g., a mesh pattern), a 15 nm $SiO_2$ hard mask is deposited using plasma enhanced chemical vapor deposition (PECVD). Next, electron beam resist of 950 k PMMA in 2% anisole is spin-coated at 2000 rpm for 60 s (~80 nm thickness) and baked at 200° C. for 2 minutes. Patterns including hexagonal ordered dot arrays with diameters of 200 nm, 400 nm, and 800 nm at pitches of 400, 600, 800, and 1000 nm are exposed using electron beam lithography and developed in 1:3 MIBK:IPA for 2 minutes.

The patterns are transferred on the $SiO_2$ hard mask by etching in 1:10 buffered oxide etchant (BOE) for 15 s. The PMMA is removed in 5 min cycles in acetone, methanol, and IPA. Then, residual PMMA is etched by $O_2$ RIE at 200 mW for 2 min. The exposed TiN patterns are etched in 1:10 $NH_4OH:H_2O_2$ (~15 nm/min). The $SiO_2$ hard mask is etched in 1:10 BOE for 15 s.

Vapor-phase and liquid-phase MacEtch are carried out using the same etchant solution (49 wt. % HF, 30 wt. % $H_2O_2$ and IPA) on the patterned samples. To carry out vapor-phase MacEtch, a 3-inch Si substrate (or sample support) is placed on a hot plate. Then, the sample to be etched, which includes a patterned TiN layer on a silicon substrate, is placed at the center of the sample support. The surface temperature of the sample support and the sample to be etched are calibrated to match the etching temperature (50° C., 60° C., 70° C., 80° C., 90° C.). A MacEtch solution of 10 ml HF, 1 ml $H_2O_2$, and 10 ml IPA is mixed. A droplet comprising 10 μL of the MacEtch solution is deposited on the sample support adjacent to the sample using an HF-resistive micro-pipette. A total of 6-8 droplets are deposited on the sample support about 2 cm away from the sample. The solution is replenished soon after the droplets are completely evaporated. The resulting etched structures are inspected using a scanning electron microscope (SEM; Hitachi S-4800).

Figure 6A:
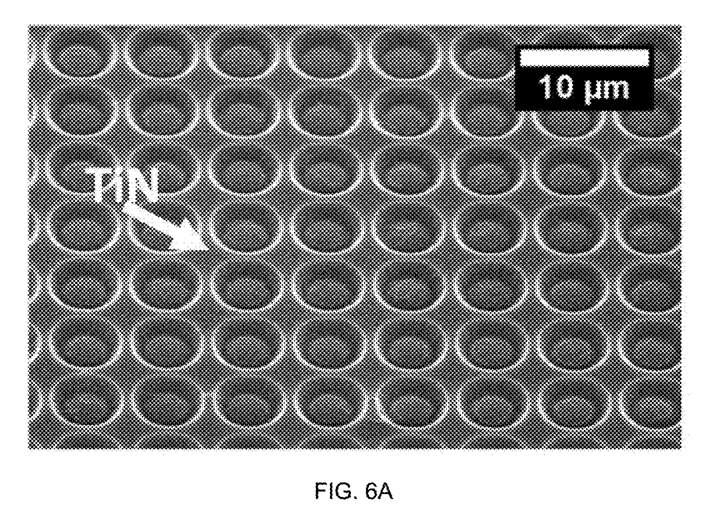
FIG. 6A shows a 45-degree tilted scanning electron microscope (SEM) image of a sample (mesh patterned TiN layer on a Si substrate) after liquid-phase MacEtch, showing evidence of inverse etching.

FIG. 6A shows a 45-degree tilted SEM image of the sample (TiN mesh pattern on Si substrate) after liquid-phase MacEtch. The sample underwent MacEtch in 0.28 M HF, 13 mM $H_2O$, 0.39 M IPA for 30 minutes at 70° C. and exhibits inverse etching; the uncovered silicon region is etched while the TiN-covered Si region remains intact, such that the etched silicon structure includes via-like etched features.

Figure 6B:
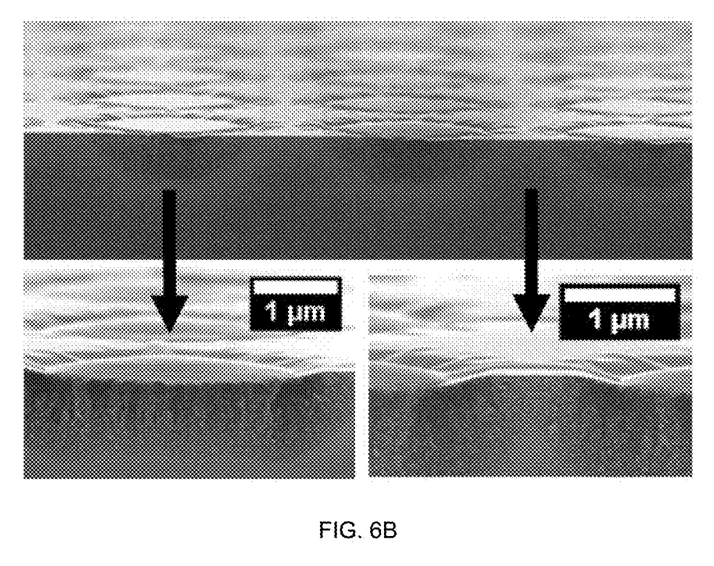
FIG. 6B shows a cross-sectional SEM image revealing the difference in porosity between TiN-covered regions and uncovered regions of the Si substrate.

FIG. 6B shows a cross-sectional SEM image of the sample (TiN mesh pattern on Si substrate) after liquid-phase MacEtch in the same solution for 5 minutes. The image shows the process of forming porous silicon in both uncovered regions (bottom left image) and TiN-covered regions (bottom right image). The silicon region underneath the TiN mesh is unevenly etched, resulting in deformation of the TiN. The porosity increases in silicon regions further from the TiN mesh, indicating that the formation and removal of $SiO_2$ is faster under in the uncovered silicon regions. These images suggest that inverse MacEtch results from limited mass transfer (MT) of the etchant under the TiN mesh; the injection and diffusion of holes occur faster than removal of the oxidized silicon formed under the TiN mesh, such that the unconsumed holes diffuse away from underneath the TiN mesh to uncovered silicon regions. This results in the formation and removal of oxidized silicon from the uncovered silicon regions.

Figure 7:
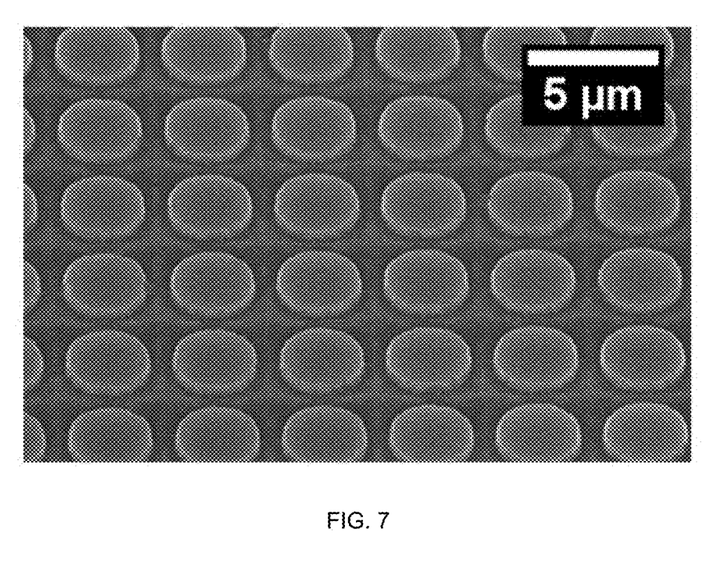
FIG. 7 shows a 45-degree tilted SEM image of a sample (mesh patterned TiN layer on a Si substrate) after vapor-phase MacEtch using the apparatus of FIG. 3, showing evidence of forward etching.

FIG. 3, which was discussed above, shows the set-up used for vapor-phase MacEtch of a sample that includes a TiN mesh pattern on a Si substrate. The sample is substantially identical to the sample that underwent liquid-phase MacEtch as described above. The sample is placed on a sample holder (in this example, a sacrificial 4-inch Si substrate) on a hot plate heated to 70° C. Droplets of 10 μL in volume comprising the same premixed MacEtch solution are dispersed on the sample holder about 1 cm away from the edge of the sample using a micropipette. MacEtch starts when the droplet comprising the MacEtch solution evaporates to form a vapor-phase etchant that diffuses on the TiN. The vapor-phase etchant is at approximately the same temperature as the sample to be etched. The droplets on the sample holder are replenished soon after the droplets are completely evaporated. Etching is carried out for five minutes. FIG. 7 shows a 45-degree tilted SEM image of the vapor-phase MacEtched sample. The TiN-covered Si regions are uniformly etched by forward MacEtch; due to the quenching of inverse MacEtch achieved by the vapor-phase process, there is minimal or no tapering of the etched features.

Figure 8:
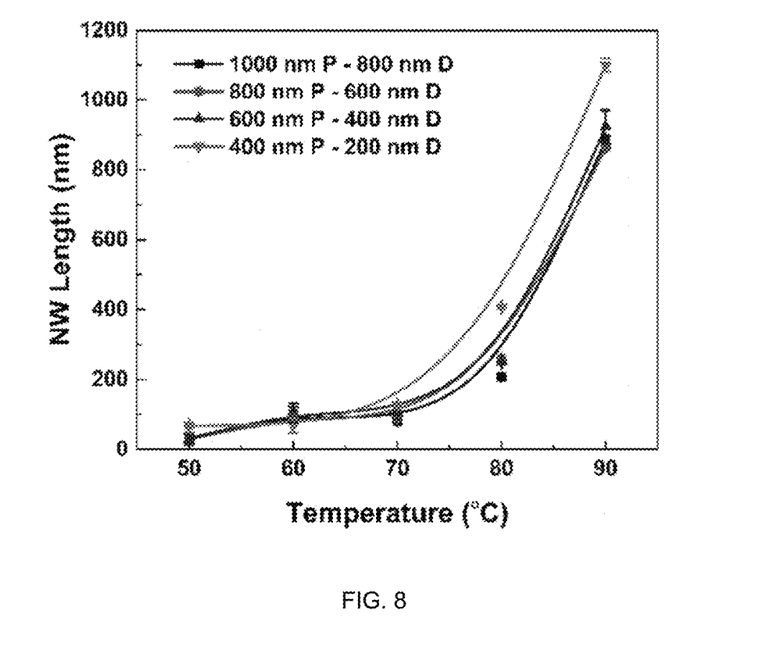
FIG. 8 shows silicon nanowire length as a function of etch temperature during vapor-phase MacEtch of a Si substrate using a mesh-patterned TiN catalyst layer.

FIG. 8 shows average length of Si nanowires formed during vapor-phase chemical etching with a mesh patterned TiN layer as set forth above (0.28 M HF, 13 mM $H_2O_2$, and 0.39 IPA) as a function of etching temperature from 50° C. to 90° C. The mesh patterned TiN layer has a fixed spacing of 100 nm and a pitch of 400 nm, 600 nm, 800 nm and 1000 nm. The data show that nanowire length, which is an indicator of forward etching, exponentially increases with increasing temperature, while the differences in the nanowire length for a fixed mesh spacing at different pitches are not significant.

Although the present invention has been described in considerable detail with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein.

Furthermore, the advantages described above are not necessarily the only advantages of the invention, and it is not necessarily expected that all of the described advantages will be achieved with every embodiment of the invention.

The invention claimed is:

1. A method of catalyst-assisted chemical etching with a vapor-phase etchant, the method comprising:
   heating a semiconductor substrate including a patterned titanium nitride layer thereon;
   evaporating an oxidant and an acid to form a vapor-phase etchant comprising an oxidant vapor and an acid vapor; and
   during the heating, exposing the semiconductor substrate and the patterned titanium nitride layer to the vapor-phase etchant, the vapor-phase etchant diffusing through the patterned titanium nitride layer and etching titanium nitride-covered regions of the semiconductor substrate, thereby forming an etched semiconductor structure.

2. The method of claim 1, wherein the semiconductor substrate comprises silicon, the oxidant comprises $H_2O_2$, and the acid comprises HF.

3. The method of claim 1, wherein the vapor-phase etchant comprises a molar ratio of the oxidant vapor to the acid vapor in a range from about 0.02 to about 10.

4. The method of claim 1, wherein the semiconductor substrate is heated to a temperature from about 30° C. to about 95° C.

5. The method of claim 1 being carried out in a controlled environment comprising an inert atmosphere or a vacuum.

6. The method of claim 1, wherein the semiconductor substrate and the vapor-phase etchant are at the same temperature.

7. The method of claim 1, wherein the patterned titanium nitride layer comprises a continuous mesh pattern, and
   wherein the etched semiconductor structure comprises an array of nanowires.

8. The method of claim 1, wherein the patterned titanium nitride layer comprises a discontinuous pattern having a plurality of discrete features, and
   wherein the etched semiconductor structure comprises an array of channels.

9. The method of claim 1, wherein uncovered regions of the semiconductor substrate are substantially unetched.

10. A method of titanium nitride-assisted chemical etching with a liquid-phase etchant comprises:
    providing a patterned TiN layer on a semiconductor substrate;
    immersing the patterned TiN layer and the semiconductor substrate into an etchant solution comprising an acid and an oxidizing agent;
    during the immersion in the etchant solution, at least a portion of the semiconductor substrate immediately below the patterned TiN layer is selectively removed, thereby forming an etched semiconductor structure.

11. The method of claim 10, wherein, during the immersion, the etchant solution comprises an elevated temperature from about 30° C. to about 95° C.

* * * * *